United States Patent
Shang et al.

(10) Patent No.: US 10,810,458 B2
(45) Date of Patent: Oct. 20, 2020

(54) INCREMENTAL AUTOMATIC UPDATE OF RANKED NEIGHBOR LISTS BASED ON K-TH NEAREST NEIGHBORS

(71) Applicant: Hewlett Packard Enterprise Development LP, Houston, TX (US)

(72) Inventors: Hongwei Shang, Palo Alto, CA (US); Mehran Kafai, Palo Alto, CA (US); Kave Eshghi, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 214 days.

(21) Appl. No.: 16/073,891

(22) PCT Filed: Dec. 3, 2015

(86) PCT No.: PCT/US2015/063702
§ 371 (c)(1),
(2) Date: Jul. 30, 2018

(87) PCT Pub. No.: WO2017/095413
PCT Pub. Date: Jun. 8, 2017

(65) Prior Publication Data
US 2019/0050672 A1   Feb. 14, 2019

(51) Int. Cl.
*G06F 16/00* (2019.01)
*G06K 9/62* (2006.01)
(Continued)

(52) U.S. Cl.
CPC .......... *G06K 9/623* (2013.01); *G06F 16/00* (2019.01); *G06F 16/901* (2019.01);
(Continued)

(58) Field of Classification Search
CPC .......... G06F 16/2379; G06F 16/24568; G06F 16/2465; G06F 16/248; G06F 16/9024;
(Continued)

(56) References Cited

U.S. PATENT DOCUMENTS

| | | | | |
|---|---|---|---|---|
| 5,440,742 A | * | 8/1995 | Schwanke | ................ G06F 8/75 717/120 |
| 7,627,596 B2 | | 12/2009 | Kwok et al. | |

(Continued)

OTHER PUBLICATIONS

International Preliminary Report on Patentability received in PCT Application No. PCT/US2015/063702, dated Jun. 14, 2018, 8 pages.

(Continued)

*Primary Examiner* — Jared M Bibbee
(74) *Attorney, Agent, or Firm* — Hewlett Packard Enterprise Patent Department

(57) ABSTRACT

Incremental automatic update of ranked neighbor lists based on k-th nearest neighbors is disclosed. One example is a system including an indexing module to retrieve an incoming data stream, and retrieve ranked neighbor lists for received data objects. An evaluator determines similarity measures between the received data objects and their respective k-th nearest neighbors. A threshold determination module determines a statistical distribution based on the determined similarity measures, and a threshold based on the statistical distribution. The evaluator determines additional similarity measures between a new data object in the data stream and the received data objects. A neighbor update module automatically selects a sub-plurality of the received data objects by comparing the additional similarity measures to the threshold, and determines, for each selected data object, if the respective retrieved neighbor list is to be incrementally updated based on neighborhood comparisons for the new data object and the selected data object.

14 Claims, 8 Drawing Sheets

(51) Int. Cl.
*G06F 17/10* (2006.01)
*H03M 7/30* (2006.01)
*G06F 16/901* (2019.01)
*G06F 16/904* (2019.01)

(52) U.S. Cl.
CPC ........ *G06F 16/904* (2019.01); *G06F 16/9024* (2019.01); *G06F 17/10* (2013.01); *G06K 9/6215* (2013.01); *G06K 9/6265* (2013.01); *G06K 9/6276* (2013.01); *H03M 7/30* (2013.01)

(58) Field of Classification Search
CPC ...... G06F 17/10; G06F 16/901; G06F 16/904; G06F 16/00; G06K 9/623; G06K 9/6215; G06K 9/6265; G06K 9/6276; H03M 7/30
See application file for complete search history.

(56) References Cited

U.S. PATENT DOCUMENTS

| | | | | |
|---|---|---|---|---|
| 9,530,081 | B2* | 12/2016 | Kami | .................. G06K 9/6215 |
| 2002/0120609 | A1 | 8/2002 | Lang et al. | |
| 2005/0031226 | A1* | 2/2005 | Sugimoto | ............ H04N 17/004 |
| | | | | 382/286 |
| 2005/0086210 | A1 | 4/2005 | Kita et al. | |
| 2007/0043774 | A1* | 2/2007 | Davis | .................. G06K 9/6254 |
| 2007/0250476 | A1 | 10/2007 | Krasnik | |
| 2009/0204551 | A1 | 8/2009 | Wang et al. | |
| 2010/0174714 | A1 | 7/2010 | Asmundsson et al. | |
| 2011/0075927 | A1 | 3/2011 | Xu et al. | |
| 2012/0239596 | A1 | 9/2012 | Lee et al. | |
| 2014/0180831 | A1* | 6/2014 | Bax | .................... G06Q 30/0275 |
| | | | | 705/14.71 |

OTHER PUBLICATIONS

International Searching Authority, the International Search Report and the Written Opinion, dated Aug. 29, 2016, PCT/US2015/063702, 11 Pgs.

Mouratidis, et al.; "Continuous Nearest Neighbor Queries over Sliding Windows"; Jun. 2007; 37 pages.

PCT International Search Report cited in Appl. No. PCT/US2015/063702 ; dated Aug. 29, 2016; 3 pages.

Zhang, et al.; "Processing Continuous k -Nearest Neighbor Queries in Location-Dependent Application"; Mar. 2006; 9 pages.

* cited by examiner

INCREMENTAL AUTOMATIC UPDATE OF RANKED NEIGHBOR LISTS BASED ON K-TH NEAREST NEIGHBORS

BACKGROUND

Big data is data that generally exceeds the processing capacity of conventional systems. Methods for analyzing big data are of great interest in many applications, including similarity search, collaborative filtering, data compression, retrieval, clustering, and classification. Graphs may be used to represent data. For example, a nearest neighbor graph may connect each data object to data objects that are nearest (or most similar) to the data object.

DETAILED DESCRIPTION

Figure 1:
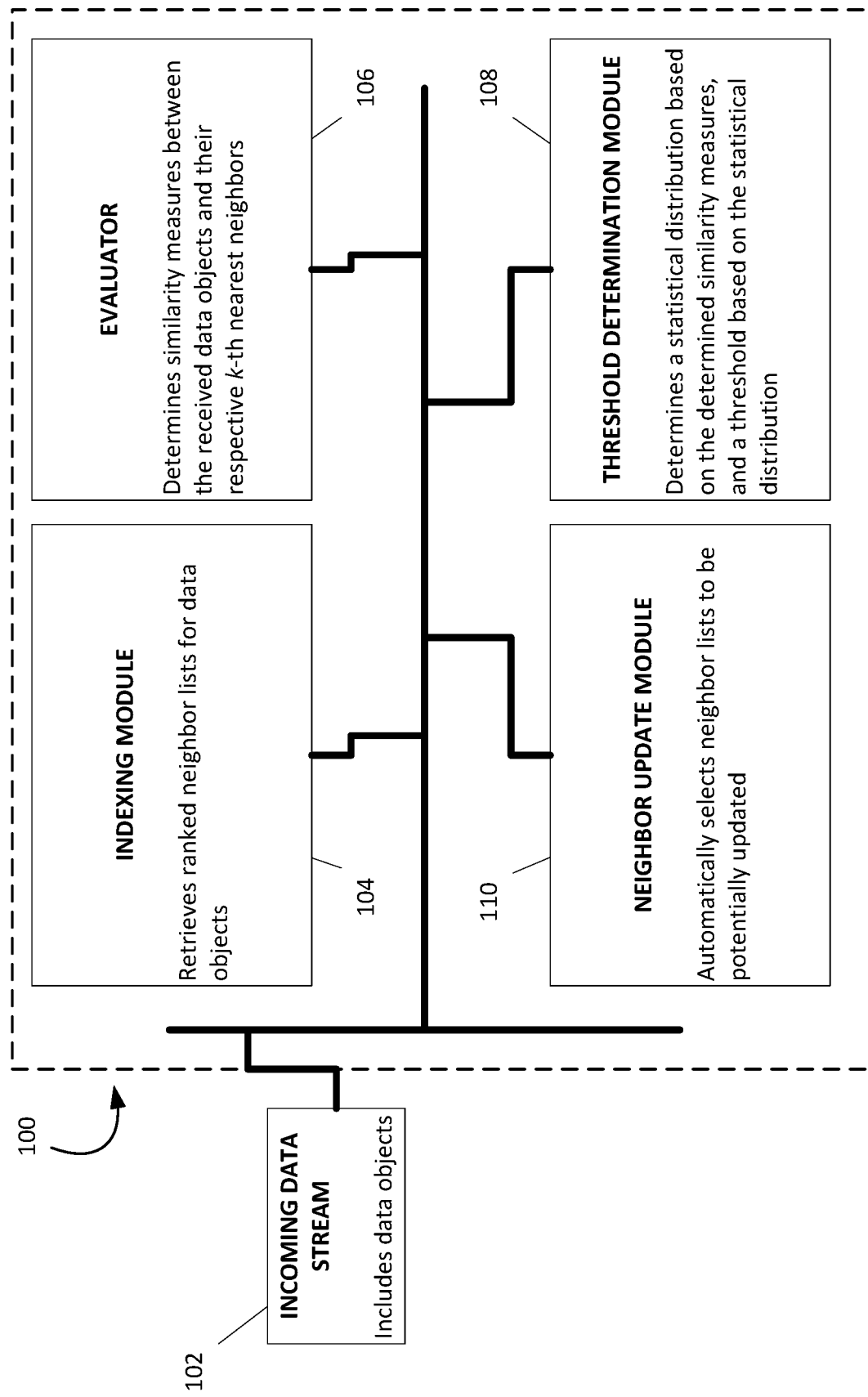
FIG. 1 is a functional block diagram illustrating one example of a system for incremental automatic update of ranked neighbor lists based on k-th nearest neighbors.

Big data may be defined as data that exceeds the processing capacity of conventional systems. Methods for analyzing such data continue to grow in prominence. Graph techniques are often applied to represent and efficiently analyze big data. One such graph representation is a k-nearest neighbor ("kNN") graph. A kNN graph comprises of nodes that are data objects, and edges that connect a data object to k proximal data objects, where proximity between data objects may be based on an appropriate similarity. The proximal data objects are generally referred to as neighbors, and a collection of neighbors for a data object is referred to as a neighbor list for the data object. In some examples, the data objects in the neighbor list may be ranked or ordered based on some criterion. For example, the list may be ranked based on proximity to a first data object. Such a neighbor list will be referred to herein as a ranked neighbor list.

A kNN graph may help represent and analyze large volumes of data by revealing nearest matches to any data object. kNN graphs are extensively used in areas such as machine learning, data mining, computer vision and image processing. Applications that utilize kNN graphs include but are not limited to similarity search, collaborative filtering, data compression, retrieval, clustering, and classification. For example, large Enterprise data warehousing applications may use collaborative filtering to sort and/or search content relevant to a particular topic thread. As another example, an online retailer may use a similarity search to make product recommendations based on a particular customer's recent purchases. Also, for example, a security firm may use nearest neighbor matches to identify known persons from live video feeds.

Generally, the challenge of these applications is to maintain performance efficiency as data grows. In some examples, the data may be large volumes of rapidly streaming data, adding to the challenge of maintaining both speed and efficiency. For kNN graphs, costs associated with graph construction, for example in terms of time and resources, are considerably high for large data sets. Additionally, as a kNN graph is continually updated based on incoming data, such costs may increase considerably.

Nearest neighbor graph constructions generally use various methods such as recursive Lanczos bisection, Morton ordering, or local search. Generally, such approaches construct the nearest neighbor graph by comparing data objects directly. Approximate algorithms such as locality sensitive hashing may reduce the comparison space, but data objects in the smaller comparison space are compared directly to each other. This is generally not effective for high velocity, high volume data streams. Some hash-based techniques may be used to update the kNN graph, but these hashing techniques often display anomalies due to a similarity measure metric distortion.

Accordingly, there is a need for a kNN graph construction and updating process that may compute and update nearest neighbors in an efficient manner, especially for high velocity, high volume data streams. As described herein, an orthogonal transform based indexing system may be used to efficiently compute the nearest neighbors of a data object in a kNN graph, and then use a local search to update the data objects in the kNN graph that are likely to change after a new data object is inserted into the kNN graph. Such a system is well-adapted for streaming data scenarios and scales well with high-dimensional data as well.

Generally, when a new data object arrives, neighbor lists for data objects in the kNN graph may need to be updated. Given the large number of data objects, such a complete update may take a long time, and may not keep pace with the rate at which incoming data objects flow in. Accordingly, it is important to be able to efficiently and accurately select a subset of the data objects for which neighbor lists may be updated. Some existing techniques perform an approximate update of nearest neighbors. Some existing techniques generally involve a determination of similarity measures between all pairs of data objects, resulting in higher number of computations and additional computational time. Such techniques may introduce additional noise in the data based on the additional computations, thereby resulting in a potential loss of accuracy of the updates to the kNN graph. Accordingly, it is important to be able to efficiently and accurately select a subset of the data objects for which ranked neighbor lists may be updated. Such a mechanism is described herein.

One significant advantage, as described herein, is reducing the number of similarity comparisons. This may be achieved, for example, by determining a similarity measure between a data object and its k-th nearest neighbor, instead of determining similarity measures between all pairs of data objects. A continuous probability distribution may be determined based on the similarity measures between data objects and their respective k-th nearest neighbors. Accordingly, each time a new data object is processed, only one similarity measure computation is performed and this single, numerical value may be added to the list of existing similarity measures to update the probability distribution. This results in a significant reduction of computational time as the number of data objects increases, and a flow rate of the incoming data stream increases. The update is accelerated by updating parameters in the fitted statistical distribution and the threshold in a fast manner. Utilizing a moment-matching method, parameters may be expressed as a function of three measures—a first moment, a second moment and a sample size, and these may be updated in real time. A cut-off threshold may be determined based on the probability distribution. Data objects for which the ranked neighbor lists may be updated may then be selected based on the threshold. Finally, the ranked neighbor lists for these selected data objects may be checked for possible updates. Accordingly, the new data object may get added to the neighbor list for the selected data object.

As described in various examples herein, automatic selection of ranked neighbor lists to be incrementally updated is disclosed. One example is a system including an indexing module to retrieve an incoming data stream of data objects, and retrieve ranked neighbor lists for the received data objects. An evaluator determines similarity measures between the received data objects and their respective k-th nearest neighbors. A threshold determination module determines a statistical distribution based on the determined similarity measures, and determines a threshold based on the statistical distribution. The evaluator determines additional similarity measures between a new data object in the data stream and the received data objects. A neighbor update module automatically selects a sub-plurality of the received data objects by comparing the additional similarity measures to the threshold, and determines, for each selected data object, if the respective retrieved neighbor list is to be incrementally updated based on neighborhood comparisons for the new data object and the selected data object.

In the following detailed description, reference is made to the accompanying drawings which form a part hereof, and in which is shown by way of illustration specific examples in which the disclosure may be practiced. It is to be understood that other examples may be utilized, and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

FIG. 1 is a functional block diagram illustrating one example of a system 100 for automatic selection of neighbor lists to be incrementally updated. System 100 includes an indexing module 104, an evaluator 106, a threshold determination module 108, and a neighbor update module 110. The indexing module 104 may receive, via a processor, an incoming data stream 102 of data objects, and retrieve neighbor lists for the received data objects. The term "retrieve" as used herein, may generally refer to accessing a database, via the processor, where the database may store a kNN graph, neighbor lists for data objects, a list of distributions, data indicative of similarities between data objects, and so forth. In some examples, the term retrieve may indicate that the indexing module 104 is communicatively linked to another system that is capable of incrementally updating a kNN graph, updating neighbor lists, and so forth. In some examples, the indexing module 104 may retrieve ranked neighbor lists.

In some examples, the neighbor lists are based on an orthogonal transform based indexing of an incrementally updated neighbor graph. For example, an orthogonal transform may be applied to a data object in the incoming data stream 102, and the data object may be associated with a subset of U ordered hash positions. A flow rate f for the incoming data stream 102, say S, may be measured as data objects received per second. In other words, every second, f number of data objects arrive via incoming data stream S. In some examples, hash transforms may generally be associated at a rate similar to the flow rate.

As described herein, a data object (e.g. a numerical N-dimensional vector) in the incoming data stream 102 may be associated with a subset of U ordered hash positions. In some examples, the subset may have a fixed size H. A hash position generally refers to a hash symbol located at an integer from the set $\{1, 2, \ldots, U\}$, where U is generally much larger than N, and N is much larger than H. Hashes may be generally used to provide a representation of the data object. Such a hash representation may be utilized for efficient comparisons between pairs of data objects. Generally, U may be a power of 2. For example, one instance may be $H=100$, $N=6000$, and $U=2^{18}$. The H hashes may be based on H largest coefficients provided by the orthogonal transform. Accordingly, an N-dimensional object may be projected onto a lower H-dimensional object.

In some examples, the incoming data stream 102 may include a plurality of vectors with numerical, real-valued components. System 100 may be provided with values for H and U. The integer H may be experimentally determined based on the type and number of data objects in the incoming data stream 102. Generally, U is a very large integer relative to H. In one example, U is a power of 2.

In some examples, the orthogonal transform may be a Walsh-Hadamard transform ("WHT"). A WHT is an orthogonal, non-sinusoidal transform that takes a signal as input and outputs a set of basis functions. The output functions are known as Walsh functions. A Walsh function takes two values: +1 and −1. Generally, performing an orthogonal transform on the incoming data stream 102 provides a set of coefficients associated with the incoming data stream 102. For example, after application of the Walsh-Hadamard transform to the data object, the indexing module 104 may retrieve a list of coefficients $c_1, c_2, \ldots, c_k$. Alternative forms of orthogonal transforms may be utilized as well. For example, a cosine transform may be utilized.

In some examples, the H largest coefficients, $c_{n_1}, c_{n_2}, \ldots, c_{n_H}$ may be selected as the subset of hashes associated with the data object, say A. Table 1 illustrates an example association of data objects A, B, and C, with sets of hashes:

TABLE 1

| Data Term | Set of Hashes |
|---|---|
| A | {1, 5, 9, 13, 16} |
| B | {2, 3, 4, 7, 13} |
| C | {1, 5, 7, 8, 11} |

In some examples, the indexing module 104 may retrieve, via the processor, an index of U ordered key positions, where each key position is indicative of received data objects of the incoming data stream 102 that have a hash position at the key position. Table 2 illustrates an example index with $U=2^4$ key positions $\{1, 2, \ldots, 16\}$ with data objects A, B, and C, based on sets of H=5 hashes in Table 1:

TABLE 2

| 1 | 2 | 3 | 4 | 5 | 6 | 7 | 8 | 9 | 10 | 11 | 12 | 13 | 14 | 15 | 16 |
|---|---|---|---|---|---|---|---|---|----|----|----|----|----|----|----|
| A |   |   |   | A |   |   |   | A |    |    |    | A  |    |    | A  |
|   | B | B |   |   | B |   |   |   |    |    |    | B  |    |    |    |
| C |   |   |   | C | C | C |   |   |    |    |    |    |    |    |    |

As illustrated, ordered key positions 1 and 5 are indicative of received data objects A and C since these data objects have hashes at the hash positions 1 and 5, as illustrated in Table 1. Likewise, ordered key position 13 is indicative of received data objects A and B since these data objects have hashes at the hash position 13, as illustrated in Table 1.

In some examples, the indexing module 104 may update the index by inserting, via the processor, a unique identifier associated with the data object into each key position of the index that corresponds to a hash position for the data object. For example, data objects B and C may have been received by system 100 prior to receiving the data object A. Accordingly, the indexing module 104 may have updated the index by inserting unique identifiers associated with the data object A. For example, the data object A may have hashes at hash positions 1, 5, 9, 13, and 16, as illustrated in Table 1. Accordingly, the indexing module 104 may update the index by inserting unique identifiers associated with the data object A at key positions 1, 5, 9, 13, and 16, as illustrated in Table 2.

The evaluator 106 may determine, via the processor, similarity measures between the received data objects and their respective k-th nearest neighbors. Generally, for the purposes of this disclosure, any quantifiable similarity measure between two data objects may be utilized as a similarity measure between the two objects. A neighbor list for a data object may be a list of additional data objects for which the similarity measures between the data object and the additional data objects is within a threshold.

In some examples, a similarity measure between the received data objects and their respective k-th nearest neighbors may be determined based on a number of common hashes. This provides an approximate measure of nearest neighbors. An approximate nearest neighbor ("ANN") search may then be performed. For example, a received data object may be mapped to a set of hashes, and this set of hashes may be utilized to search for neighbors in the incoming data stream 102 based on the similarity measure. The similarity measure may be based on a number of overlaps between respective sets of hashes, and is indicative of proximity of the pair of data objects. Table 3 illustrates an example determination of similarity measures for pairs formed from the data objects A, B, and C:

TABLE 3

| Data Object Pair: (X, Y) | Similarity Measure: S(X, Y) |
|---|---|
| (A, B) | S(A, B) = 1 |
| (A, C) | S(A, C) = 2 |
| (B, C) | S(B, C) = 1 |

As illustrated in Table 2, the data objects A and B have key position 13 in common in their respective sets of hashes. Accordingly, the similarity measure for the pair (A,B), denoted as S(A,B) may be determined to be 1. Also, for example, as illustrated in Table 2, the data objects A and C have key positions 1 and 5 in common in their respective sets of hashes. Accordingly, the similarity measure for the pair (A,C), denoted as S(A,C) may be determined to be 2. As another example, as illustrated in Table 2, the data objects B and C have key position 7 in common in their respective sets of hashes. Accordingly, the similarity measure for the pair (B,C), denoted as S(B,C) may be determined to be 1.

In some examples, the indexing module 104 may retrieve a ranked neighbor list for the data object in a neighbor graph, where the ranking is based on the index. A neighbor graph, such as a kNN graph for stream S, is a time-varying directed graph where each vertex (representing an object) is connected to similar vertices. In some examples, each vertex may be connected to its top-k most similar vertices via a directed edge. For streaming data scenarios with a high flow rate, it may be desirable to construct an approximate kNN graph and update it after every data object arrival/insertion. For a flow rate of f, this may generally involve f updates per second. As described herein, in some examples, an approximate nearest neighbor list of k nearest neighbors for the data object may be maintained. Such a list may be incrementally updated with the arrival of each new data object in the incoming data stream 102.

Generally, when a new data object arrives (say n-th data object), a naïve approach may be to update all previous (n−1) lists for the (n−1) data objects received prior to the n-th data object. This may lead to $$n\frac{(n-1)}{2}$$

nearest neighbor list updates or $\vartheta(n^2)$ complexity for updating the kNN graph. This estimate does not take into account the time taken to retrieve the nearest neighbors.

In some examples, the indexing module 104 may maintain a database of ranked neighbor lists associated with data objects in the incoming data stream 102. In some examples, the ranked neighbor list for the data object may comprise top k nearest neighbors (e.g., based on the similarity measure) determined based on a count of overlapping hash positions in the updated index. In some examples, the ranked neighbor list for the data object may comprise a predetermined number of neighbors. In some examples, the ranked neighbor list for the data object may comprise neighbors that are approximately close to the data object. For example, neighbors may be determined to be ones that have similarity measures in the range 3 to 5. An example illustration of the ranked list is described herein with respect to a second data object.

In some examples, a hash transform may be applied to the second data object, where the second data object is received after the new data object, and a new ranked neighbor list may be determined for the second data object based on the updated index. For example, the second data object Q may be received after a new data object A, which, in turn, may be received after the received data objects B and C. The second data object Q may be associated with a subset of U ordered hash positions, say {1, 5, 7, 9, 13}. Table 4 illustrates an example updated index with U=$2^4$ key positions {1, 2, . . . , 16} with data objects A, B, C, and Q:

TABLE 4

| 1 | 2 | 3 | 4 | 5 | 6 | 7 | 8 | 9 | 10 | 11 | 12 | 13 | 14 | 15 | 16 |
|---|---|---|---|---|---|---|---|---|----|----|----|----|----|----|----|
| A |   |   |   | A |   |   |   | A |    |    |    | A  |    |    | A  |
|   | B | B | B |   | B |   |   |   |    |    |    | B  |    |    |    |
| C |   |   |   | C | C | C |   |   |    |    | C  |    |    |    |    |
| Q |   |   |   | Q | Q |   | Q |   |    |    |    | Q  |    |    |    |

Table 5 illustrates an example list of terms associated with the second data object Q illustrated in Table 4, and the corresponding similarity measures.

TABLE 5

| 1 | 5 | 6 | 7 | 9 | 10 | 13 | Similarity Measures |
|---|---|---|---|---|----|----|---------------------|
| A | A |   |   | A |    | A  | S(Q, A) = 4         |
|   |   |   | B |   |    | B  | S(Q, B) = 2         |
| C | C |   | C |   |    |    | S(Q, C) = 3         |

As illustrated, the set of hashes associated with the second data object Q may be compared with the indexed data objects illustrated in Table 2. Based on such a comparison, index position 1 is indicative of a hash position associated with Q and index position 1 is also indicative of hash positions associated with data objects A and C. Also, for example, index position 5 is indicative of a hash position associated with Q, and index position 5 is also indicative of hash positions associated with data objects A and C. As another example, index position 13 is indicative of a hash position associated with Q, and index position 13 is also indicative of hash positions associated with data objects A and B. A frequency of occurrence for A may be determined to be 4. This is also the similarity measure for the pair Q and A. A frequency of occurrence for B may be determined to be 2. This is also the similarity measure for the pair Q and B. A frequency of occurrence for C may be determined to be 3. This is also the similarity measure for the pair Q and C.

As described herein, in some examples, a new ranked neighbor list for the second data object may be determined based on an updated index (e.g., as illustrated in Table 4). For example, based on a similarity measure of the second data object with each data object, a new ranked neighbor list may be determined for the second data object. Based on the example illustrated in Table 5, the new ranked neighbor list for the second data object Q may be determined to be A, C, and B.

Generally, the indexing module 104 may access an incrementally updated neighbor graph, and/or neighbor lists. The term "incremental update", as used herein, generally refers to an iterative update of at least one of the neighbor graph, the neighbor lists, the statistical distribution, the threshold, and so forth, as data objects arrive in the incoming data stream 102. As described herein, such an incremental update may be based on a local determination of neighborhood relations. For example, although an incoming data object may be a nearest neighbor for a large number of previously received data objects, an appropriate sub-list of these received data objects may be selected for an incremental update, the neighbor graph may be updated to reflect a change in neighborhoods for the selected data objects. In some examples, the neighbor graph may be incrementally updated by including a new data object as a neighbor for a selected sub-plurality of data objects in the ranked list, where the selection is based on neighborhood comparisons for the data object and data objects in the ranked list.

In some examples, the neighborhood comparisons may be based on comparisons between the ranked neighbor list for the data object and additional ranked neighbor lists of neighbors for data objects in the ranked list. For example, when a data object x is received by system 100, a ranked list B(x) associated with the data object x may be determined. In some examples, a list of top-m most similar data objects (e.g., highest similarity measures with respect to the data object x) may be selected from ranked list B(x), say $x_1$, $x_2$, . . . , $x_m$. In some examples, each of these data objects may be associated with respective additional ranked neighbor lists, $B(x_1)$, $B(x_2)$, . . . , $B(x_m)$.

In some examples, the additional ranked list $B(x_1)$ corresponding to the data object $x_1$ may comprise neighbor $x_{11}$, $x_{12}$, . . . , where $x_{11}$ is closest to $x_1$, and $x_{1k}$ is the k-th furthest away from $x_1$. A notion of similarity measure-based terms "close" and "further", as used herein, may be defined quantitatively with respect to, for example, the similarity measures determined herein. For example, two data objects that have a larger count of overlapping hashes (e.g., a larger similarity measure) may be determined to be closer than two data objects that have a smaller count of overlapping hashes (e.g., a smaller similarity measure). For example, with reference to Table 3, the data objects A and C are closer (with similarity measure 2) than the data objects A and B (with similarity measure 1).

In some examples, the neighbor graph may be updated by comparing the similarity measure from $x_1$ to the data object in $B(x_1)$ that is furthest away from for example, $x_{1k}$, with the similarity measure from $x_1$ to x. If the similarity measure from $x_1$ to x is greater than the similarity measure from $x_1$ to $x_{1k}$, then the neighbor update module 110 may incrementally update the neighbor graph to include x in the ranked list $B(x_1)$ corresponding to the data object $x_1$, and add x as a neighbor for $x_1$. In some examples, the neighbor update module 110 may perform such a comparison for each data object in $B(x_1)$. Accordingly, an updated ranked list may be determined for $x_1$.

In some examples, the neighbor update module 110 may repeat, concurrently, and/or iteratively, the process described with reference to $B(x_1)$ for each of the top-m data objects $x_1$, $x_2$, . . . , $x_m$ in the ranked list B(x) associated with the data object x. The number of neighbor comparisons may be further reduced by using a search algorithm (e.g., a binary search) and/or an efficient data structure to store the neighbor graph, the index, and/or the ranked neighbor lists for each data object.

A critical parameter for the process, as described herein, is the parameter m, corresponding to the top-m data objects $x_1$, $x_2$, . . . , $x_m$ in the ranked list B(x). In some examples, a value for the parameter m may be determined by experimenting with an accuracy of incremental update of neighbor graphs determined based on different values of the parameter m. This parameter m may be determined automatically, as described herein.

System 100 includes a threshold determination module 108 to determine a statistical distribution based on the determined similarity measures. More formally, if the received data objects are denoted as $o_1$, $o_2$, . . . , $o_n$, and the similarity measure between the data object $o_i$, and its k-th nearest neighbor $o_i^k$ is denoted as $\zeta_{o_i,o_i^k}$, we may assume that $\zeta_{o_i,o_i^k}$ follows a statistical distribution. In some examples the statistical distribution may be a Beta distribution Beta($\alpha,\beta$). Although the description herein refers to the Beta distribution, other statistical distributions may be utilized as well. For example, a uniform distribution may be utilized. In some examples, a normal distribution may be utilized, such as a univariate normal distribution.

The Beta distribution is a family of continuous probability distributions defined on the interval [0,1] and parameterized by two positive shape parameters. The probability density function of Beta distribution with shape parameters $\alpha, \beta$, may be given by:

$$g(x) = \frac{1}{B(\alpha, \beta)} x^{\alpha-1} (1-x)^{\beta-1}, \quad \text{(Eqn. 1)}$$

where $$B(\alpha, \beta) = \frac{\Gamma(\alpha)\Gamma(\beta)}{\Gamma(\alpha+\beta)} \quad \text{(Eqn. 2)}$$

In some examples, the Beta distribution may be determined based on moment matching techniques. For example, for the received data objects are denoted as $o_1, o_2, \ldots, o_n$, with respective k-th nearest neighbors, $o_1^k, o_2^k, \ldots, o_n^k$, the first and second moments for the respective distributions of similarity measures, $\zeta_{o_1,o_1^k}, \zeta_{o_2,o_2^k}, \ldots \zeta_{o_n,o_n^k}$, may be determined. Accordingly, the parameters $\alpha, \beta$ for the Beta distribution may be determined based on the first and second moments, and the number of received data objects, n.

In some examples, the evaluator 106 determines additional similarity measures between a new data object $o_{n+1}$ in the data stream 102 and the received data objects. A statistical distribution of similarities between a data object $o_i$ and data objects in its neighbor list may be determined. For example, let $o_i^{(k,n)}$ denote the k-th nearest neighbor for $o_i$ in its ranked neighbor list of n data objects. Accordingly, the similarity measure $\zeta_{o_i,o_i^{(k,n)}}$ is the k-th largest value among similarity measures $\zeta_{o_i,o_1}, \zeta_{o_i,o_2}, \ldots, \zeta_{o_i,o_n}$. Based on a probability distribution function for the Beta distribution, As each new data object is processed, the Beta distribution may be updated based on the similarity measure of the new data object and its k-th nearest neighbor, $\zeta_{o_{n+1},o_{n+1}^k}$. One significant advantage of the techniques described herein is that the first and second moments may be incrementally updated by adding, respectively, one additional value to the existing first and second moments. This results in a significant reduction of computational time.

More formally, a moment matching method is a technique for constructing estimators of the parameters based on matching the sample moments with the corresponding distribution moments. For example, the parameters of the Beta distribution may be determined based on n sample data points $v_1 = \zeta_{o_1,o_1^k}, v_2 = \zeta_{o_2,o_2^k}, \ldots v_n = \zeta_{o_n,o_n^k}$. First and second moments may be determined respectively as:

$$E(v) = \frac{1}{n} \sum_{i=1}^{n} v_i, \; E(v^2) = \frac{1}{n} \sum_{i=1}^{n} v_i^2. \quad \text{(Eqn. 3)}$$

Accordingly, it may be determined that:

$$E(v) = \frac{\alpha}{\alpha+\beta}, \; E(v^2) = \frac{\alpha(\alpha+1)}{(\alpha+\beta)(\alpha+\beta+1)}, \quad \text{(Eqn. 4)}$$

Based on Eqn. 4 and Eqn. 5, the parameters for the Beta distribution may be estimated as:

$$\hat{\alpha} = \frac{\Sigma v_i - \Sigma v_i^2}{n(\Sigma v_i^2 / \Sigma v_i) - \Sigma v_i}, \; \hat{\beta} = \hat{\alpha}\left(\frac{n}{\Sigma v_i} - 1\right). \quad \text{(Eqn. 5)}$$

As each new data object is processed, the first and second moments, and the number of data objects may be updated. Accordingly, Equations 4-6 may be utilized to determine the parameters of the Beta distribution.

The threshold determination module 108 determines a threshold based on the statistical distribution. For example, when the new data object $o_{n+1}$ in the data stream 102 is received, the indexing module 104 retrieves a neighbor list for the new data object $o_{n+1}$, say $o_{n+1}^{(1,n+1)}$, $o_{n+1}^{(2,n+1)}, \ldots, o_{n+1}^{(n,n+1)}$. As described herein, the evaluator 106 determines additional similarity measures between the new data object in the data stream 102 and the received data objects. In some examples, the additional similarity measures may be determined based on the index, as described herein. It may be noted that as each data object, it is incrementally added to the list of received data objects. For example, when the new data object $o_{n+1}$ is received, the list of received data objects includes $o_1, o_2, \ldots, o_n$. However, when a second data object $o_{n+2}$ is received, the list of received data objects is updated to include $o_1, o_2, \ldots, o_n$, $o_{n+1}$. This process may continue iteratively as each new object is received in the incoming data stream 102.

As described herein, the parameter m is representative of a number of data objects of the received data objects for which the respective neighbor lists may need to be updated when the new data object $o_{n+1}$ is received. In some examples, this may be determined by controlling a probability that a neighbor list for a data object among $o_{n+1}^{(1,n+1)}$, $o_{n+1}^{(2,n+1)}, \ldots, o_{n+1}^{(n,n+1)}$ fails to be updated when the respective distribution of $\zeta_{o_i,o_i^{(k,n)}}$ falls below the determined threshold $\zeta_\omega$. Such a probability may be determined, for example, by comparing a similarity measure between $o_{n+1}$ and its j-th nearest neighbor $o_{n+1}^{(j,n+1)}$, and a similarity measure between $o_{n+1}^{(j,n+1)}$ and its k-th nearest neighbor before the new data object $o_{n+1}$ is received.

In some examples, the threshold may be adjusted based on a miss rate, where the miss rate is indicative of a margin of error in updating a neighbor list for a received data object when the new data object is received. For example, the threshold may be based on a miss rate $\omega$. In some examples, the miss rate $\omega$ may be input by a user via a graphical user interface on a computing device. Accordingly, the threshold $\zeta_\omega$ may be determined as:

$$\Pr(\zeta_\omega > \zeta_{o_i,o_i^{(k,n)}}) = \omega \quad \text{(Eqn. 6)}$$

where threshold $\zeta_\omega$ may be determined based on the probability density function of $\zeta_{o_i,o_i^{(k,n)}}$.

Table 6 presents average running times for an "update-all neighbors" approach and the incremental automatic update of ranked neighbor lists, as described herein, for different values of n and $\omega$. The average running times are provided in milliseconds. Generally, the "update-all neighbors" approach has linear time complexity whereas the incremental automatic update approach has logarithmic complexity. Accordingly, the incremental automatic update approach is significantly faster than the "update-all neighbors" approach.

TABLE 6

| | n | | | | | | | | |
|---|---|---|---|---|---|---|---|---|---|
| | 1000 | 2000 | 3000 | 4000 | 5000 | 6000 | 7000 | 8000 | 9000 |
| Update-all | 4864 | 8034 | 11128 | 14291 | 17478 | 20510 | 23835 | 26969 | 30176 |
| ω = 0.01 | 19.24 | 24.01 | 28.62 | 32.55 | 36.13 | 39.58 | 43.47 | 45.63 | 48.82 |
| ω = 0.05 | 14.31 | 16.80 | 18.85 | 20.28 | 21.63 | 22.68 | 24.59 | 24.89 | 26.35 |
| ω = 0.10 | 12.34 | 13.87 | 15.11 | 15.92 | 16.66 | 17.28 | 18.89 | 18.95 | 20.09 |
| ω = 0.15 | 11.20 | 12.30 | 13.17 | 13.74 | 14.27 | 14.88 | 16.36 | 16.41 | 17.49 |
| ω = 0.20 | 10.39 | 11.27 | 11.95 | 12.44 | 12.92 | 13.47 | 14.97 | 15.07 | 16.19 |

Figure 2:
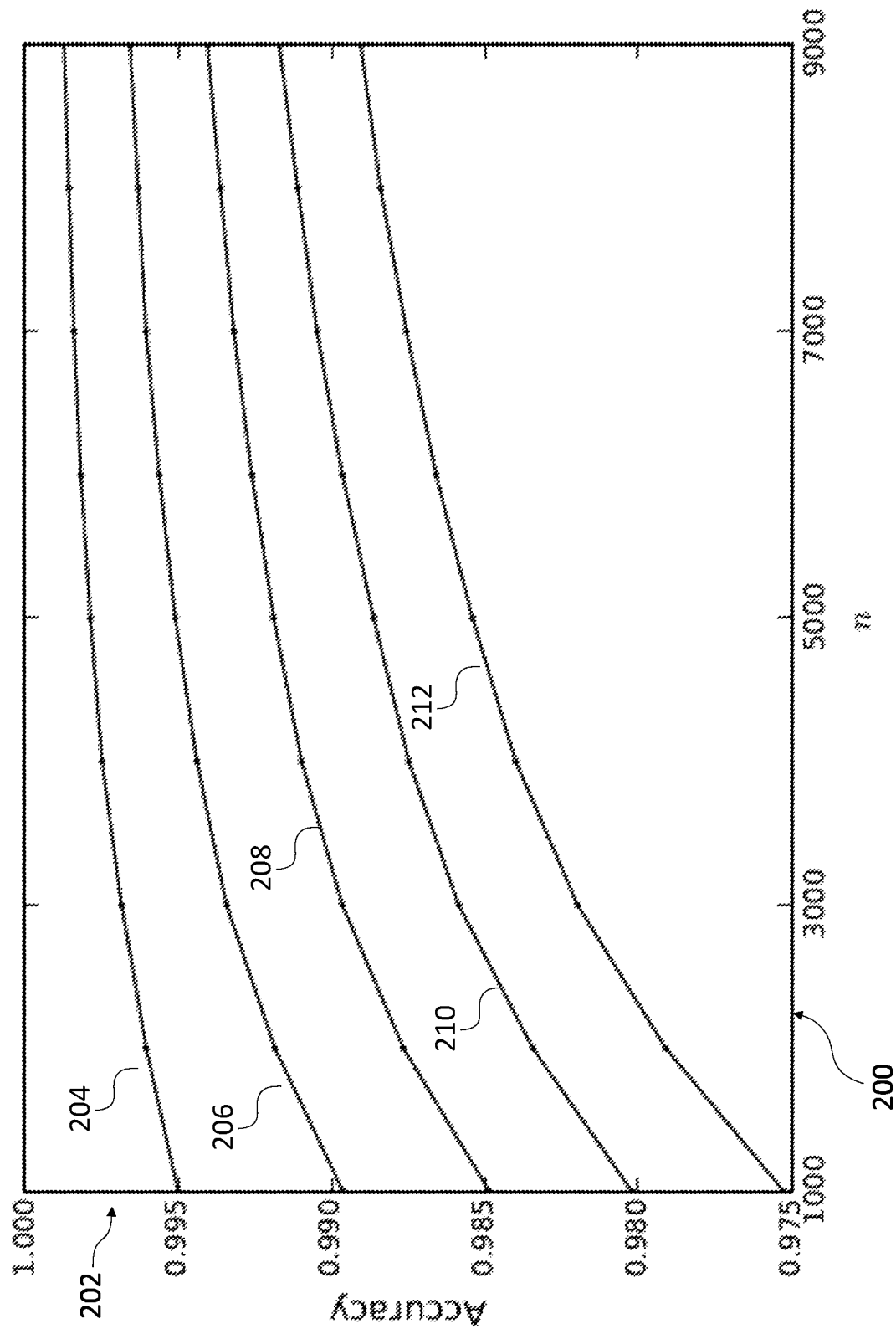
FIG. 2 is an example graphical illustration of average accuracies for incremental automatic update of ranked neighbor lists based on k-th nearest neighbors.

FIG. 2 is an example graphical illustration of average accuracies for incremental automatic update of ranked neighbor lists based on k-th nearest neighbors. An accuracy of a kNN graph may be determined as a percentage of a ratio of common k-nearest neighbors to k for all data objects. FIG. 2 illustrates a graphical representation of average accuracy, represented on the vertical axis 202 (or y-axis), with respect to a total number of data objects, n, represented on the horizontal axis 200 (or x-axis). First graph 204 represents average accuracy for ω=0.01, second graph 206 represents average accuracy for ω=0.05, third graph 208 represents average accuracy for ω=0.10, fourth graph 210 represents average accuracy for ω=0.15, and fifth graph 212 represents average accuracy for ω=0.20.

As described herein, the incremental update process does not compute similarity measures and/or similarity measures between every possible pairs of potential and/or actual neighbors. Generally, a cost of a single operation may be less expensive than existing approaches that directly compare all or a subset of the data points. The process described herein does not depend on a dimensionality of x, thereby enhancing run-time efficiencies. Also, as described herein, the critical value m of neighbor lists to be updated is generally considerably smaller than the total number of data objects n.

Referring again to FIG. 1, system 100 includes the neighbor update module 110 to automatically select a sub-plurality of the received data objects by comparing the additional similarity measures to the threshold, and to determine, for each selected data object, if the respective retrieved neighbor list is to be incrementally updated based on neighborhood comparisons for the new data object and the selected data object. For example, once the threshold is determined, the additional similarity measures between the new data object in the data stream 102 and the received data objects may be compared to the threshold. For the received data objects for which the additional similarity measure is above the threshold value, the respective neighbor list is checked for a possible update. The update of the neighbor list is based on comparing the neighbor list for the new data object and the qualifying received data object, as described herein. However, instead of determining potential updates to n neighbor lists, where n is generally a very large number, the neighbor update module 110 only checks for potential updates for a relatively smaller number, m, of neighbor lists for the n received data objects.

In some examples, the threshold determination module 108 updates the statistical distribution by including a similarity measure between the new data object and its k-th nearest neighbor, and updates the threshold based on the updated statistical distribution, and the neighbor update module 110 utilizes the updated threshold to determine if a second data object, received after the new data object, is to be included in retrieved neighbor lists for a second sub-plurality of data objects. For example, the parameters for the Beta distribution may be updated by including the additional similarity measures corresponding to the new data object to the determined similarity measures corresponding to the received data objects. Accordingly, an updated threshold may be determined. Also, for example, the new data object is added to the list of received data objects. Accordingly, when the second data object is received in the incoming data stream 102, the neighbor update module 110 may select a second sub-plurality of data objects, and check neighbor lists for the data objects of the second sub-plurality of data objects for potential updating.

In some examples, the neighbor update module 110 may provide, via the processor to a computing device, an incrementally updated computer generated visual rendition of neighbor lists for data objects in the incoming data stream 102. For example, as each data object is received by system 100 and processed as described herein, the neighbor update module 110 may retrieve the updated ranked neighbor lists, and display the data objects in the neighbor graph by adding nodes for the data objects, and by adding vertices between data objects to indicate updated neighbor relations between data objects. For example, when the data object x is added to the ranked list $B(x_1)$ for $x_1$ via removal of a previous neighbor $x_{1k}$, the neighbor update module 110 may generate an incrementally updated visual rendition of the neighbor graph by adding a node representing x to the neighbor graph, and by adding an edge between x and $x_1$, indicative of an addition of x as a neighbor for $x_1$. Also, for example, the neighbor update module 110 may generate an incrementally updated visual rendition of the neighbor graph by removing an edge between $x_{1k}$ and $x_1$, indicative of a deletion of $x_{1k}$ as a neighbor for $x_1$.

Figure 3:
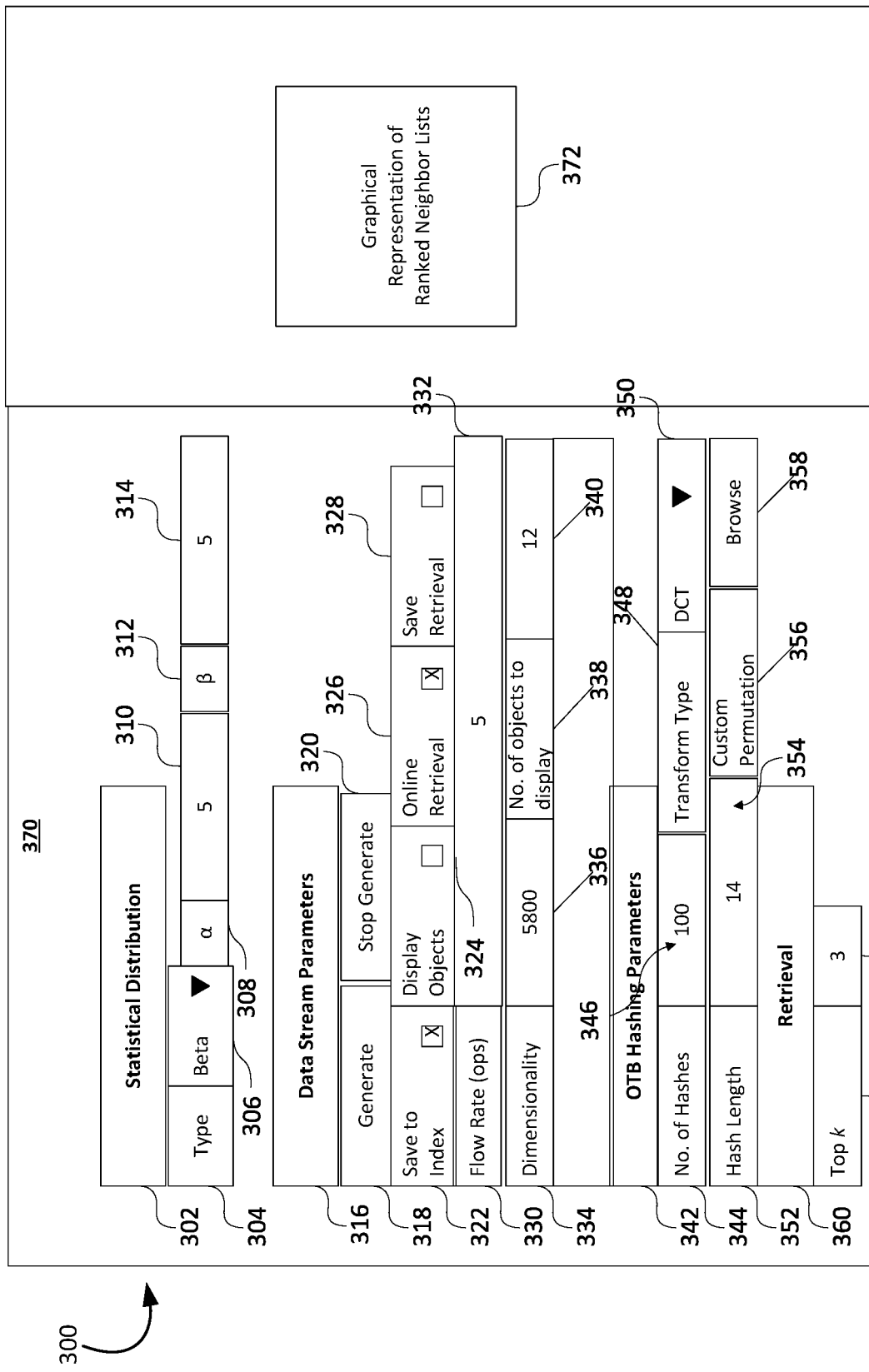
FIG. 3 is a schematic representation of an example of an incrementally updated computer generated visual rendition of ranked neighbor lists based on an incremental automatic update of ranked neighbor lists.

FIG. 3 is a schematic representation of an example of an incrementally updated computer generated visual rendition 300 of neighbor lists based on an incremental automatic update of ranked neighbor lists. In some examples, the visual rendition 300 may comprise a dashboard 370 and a graphical representation of ranked neighbor lists 372. In some examples, the dashboard 370 may be web-based dashboard with interactive user interfaces. In some examples, the graphical representation 372 may be an incrementally updated kNN graph. In some examples, the graphical representation 372 may be an incrementally updated collection of neighbor lists in tabular form indicative of respective rankings.

In some examples, the dashboard 370 may include user interfaces to select a statistical distribution 302, select data stream parameters 316, input orthogonal transform based ("OTB") hashing parameters 342, and input retrieval parameters 360.

In some examples, the user interfaces to select the statistical distribution 302 may include a parameter for the type 304 of statistical distribution. The type 304 of the statistical distribution may include a beta distribution, a binomial distribution, and so forth. For example, a drop-down menu may be provided to select the type of statistical distribution. As illustrated, in some examples, a beta distribution 306 may be selected and a first parameter α 308 may be provided, and a first user interface 310 may allow for input of a desired value for α. For example, a value of 5 may be input for α in the first user interface 310. Likewise, a second parameter β 312 may be provided, and a second user interface 314 may allow for input of a desired value for β. For example, a value of 5 may be input for β in the second user interface 314.

In some examples, the user interfaces to select the data stream parameters 316 may include a first option 318 to generate the graphical representation 372, and a second option 320 to stop generating the graphical representation 372. Additional selectable options may be provided, for example, a selectable option to "Save to Index" 322 that updates the index, a selectable option to "Display Objects" 324 that displays the data objects, a selectable option for "Online Retrieval" 326 that retrieves data objects, and a selectable option to "Save Retrieval" 328 that saves the retrieved data objects.

Also, for example, user interfaces may be provided to input parameters for the data stream. For example, a third user interface 332 may be provided to input a flow rate 330 for the data stream. For example, a flow rate of "5" may be input, and the data stream may be received at the rate of 5 objects per second ("ops"). A fourth user interface 336 may be provided to input a value for dimensionality 334 of the data objects. For example, a value of 5800 may be input in the fourth user interface 336 indicating that the data objects may comprise 5800-dimensional vectors. A fifth user interface 340 may be provided to input a number of data objects 338 to be displayed. For example, a value of 12 may be input in the fifth user interface 340, and accordingly 12 data objects may be displayed in the graphical representation 372.

In some examples, the user interfaces to input the OTB hashing parameters 342 may include a sixth user interface 346 to input a number of hashes 344. For example, a value of 100 may be input in the sixth user interface 346, and accordingly 100 hashes may be utilized for the hash based transformations described herein. Also, for example, a drop-down menu 350 may be provided to allow selection of a transform type 348. The transform type 348 may include, for example, a discrete cosine transform ("DOT"), a Walsh-Hadamard transform ("WHT"), and so forth. A seventh user interface 354 may be provided to input a hash length 352. For example, a value of 14 may be input in the seventh user interface 354, and accordingly the hash length may be set to 14 for the hash based transformations described herein. Also, for example, a menu option 358 may be provided to select a custom permutation 356.

In some examples, the user interfaces to input the retrieval parameters 360 may include an eighth user interface 364 to input a number for the top k neighbors to be retrieved. For example, a value of 3 may be input in the eighth user interface 364, and accordingly the top 3 nearest neighbors (based on similarity measures) may be updated for each data object.

Referring again to FIG. 1, the components of system 100 may be computing resources, each including a suitable combination of a physical computing device, a virtual computing device, a network, software, a cloud infrastructure, a hybrid cloud infrastructure that may include a first cloud infrastructure and a second cloud infrastructure that is different from the first cloud infrastructure, and so forth. The components of system 100 may be a combination of hardware and programming for performing a designated visualization function. In some instances, each component may include a processor and a memory, while programming code is stored on that memory and executable by a processor to perform a designated function.

For example, the indexing module 104 is a combination of hardware and programming to receive, via the processor, the incoming data stream 102 of data objects, and retrieve ranked neighbor lists for the received data objects. For example, the indexing module 104 may include software programming to automatically retrieve an updated hash-based index via the processor. Also, for example, the indexing module 104 may include hardware to physically store, for example, the ranked neighbor lists. Also, for example, the indexing module 104 may include a combination of hardware and software programming to dynamically interact with the other components of system 100.

Likewise, the evaluator 106 is a combination of hardware and programming. For example, the evaluator 106 may include software programming instructions to determine, via the processor, similarity measures between the received data objects and their respective k-th nearest neighbors. Also, for example, the evaluator 106 may include hardware to physically store, for example, the determined similarity measures. The evaluator 106 may include a combination of hardware and software programming to dynamically interact with the other components of system 100.

Also, for example, the threshold determination module 108 is a combination of hardware and programming. For example, the threshold determination module 108 may include software programming instructions to determine a statistical distribution based on the determined similarity measures. As another example, the threshold determination module 108 may include software programming instructions to determine a threshold based on the statistical distribution. In some examples, the threshold determination module 108 may include software instructions to interact with a computing device to receive a miss rate, and to determine the threshold based on the miss rate. The threshold determination module 108 may include a combination of hardware and software programming to dynamically interact with the other components of system 100.

Likewise, the neighbor update module 110 is a combination of hardware and programming. For example, the neighbor update module 110 may include software programming instructions to automatically select a sub-plurality of the received data objects by comparing the additional similarity measures to the threshold. As another example, the neighbor update module 110 may include software programming instructions to determine, for each selected data object, if the respective retrieved neighbor list is to be incrementally updated based on neighborhood comparisons for the new data object and the selected data object. The neighbor update module 110 may include a combination of hardware and software programming to dynamically interact with the other components of system 100.

Generally, as described herein, the components of system 100 may include software programming and physical networks to be communicatively linked to other components of system 100. In some instances, the components of system 100 may include a processor and a memory, while programming code is stored and on that memory and executable by a processor to perform designated functions.

A computing device, as used herein, may be, for example, a web-based server, a local area network server, a cloud-based server, a notebook computer, a desktop computer, an all-in-one system, a tablet computing device, a mobile phone, an electronic book reader, or any other electronic device suitable for provisioning a computing resource to perform a unified visualization interface. The computing device may include a processor and a computer-readable storage medium.

Figure 4:
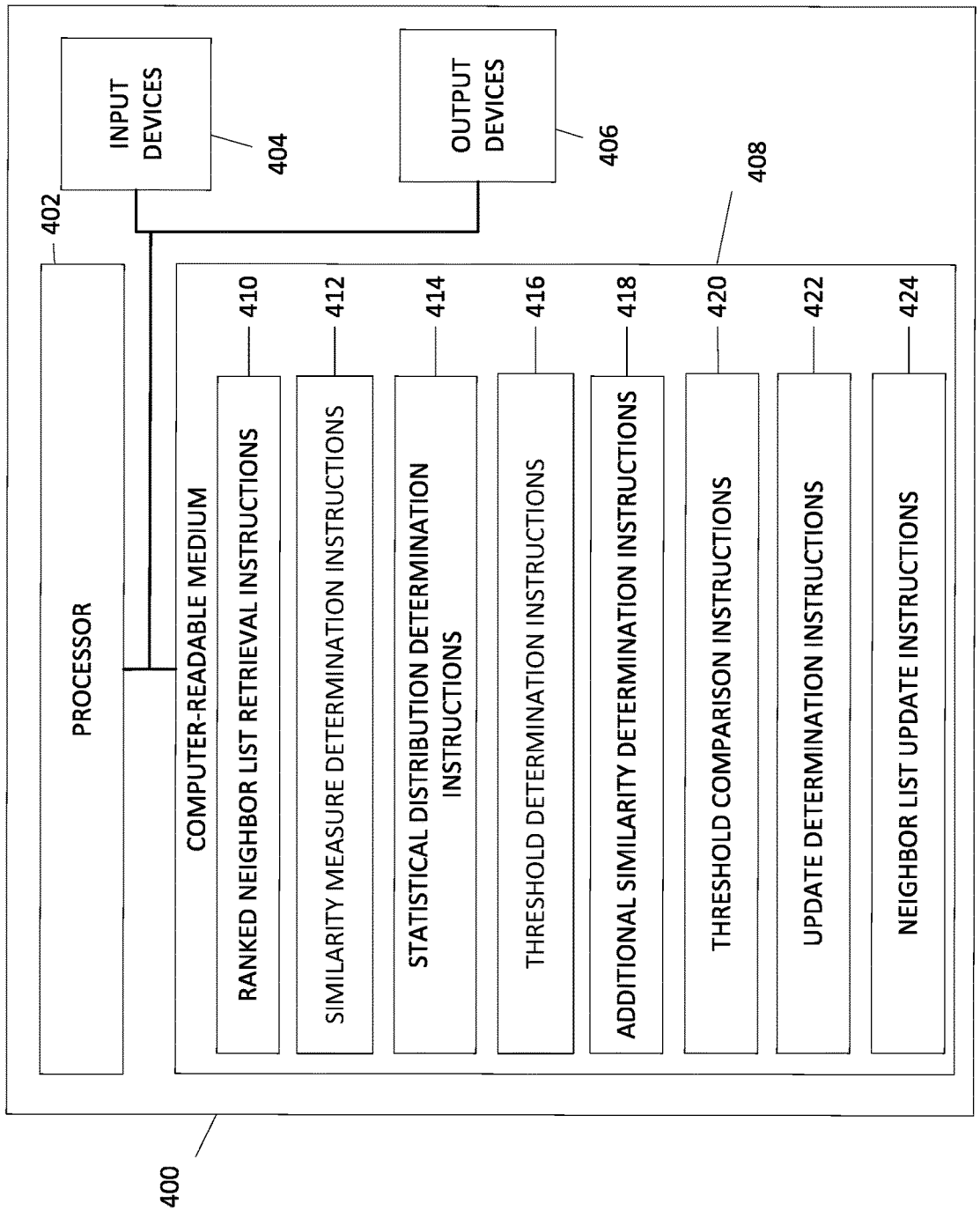
FIG. 4 is a block diagram illustrating one example of a computer readable medium for incremental automatic update of ranked neighbor lists based on k-th nearest neighbors.

FIG. 4 is a block diagram illustrating one example of a computer readable medium for automatic selection of neighbor lists to be incrementally updated. Processing system 400 includes a processor 402, a computer readable medium 408, input devices 404, and output devices 406. Processor 402, computer readable medium 408, input devices 404, and output devices 406 are coupled to each other through a communication link (e.g., a bus).

Processor 402 executes instructions included in the computer readable medium 408. Computer readable medium 408 includes ranked neighbor list retrieval instructions 410 to retrieve, via a processor, ranked neighbor lists for received data objects in an incoming data stream. In some examples, the ranked neighbor lists are based on an orthogonal transform based indexing of an incrementally updated neighbor graph.

Computer readable medium 408 includes similarity measure determination instructions 412 to determine, via the processor, similarity measures between the received data objects and their respective k-th nearest neighbors.

Computer readable medium 408 includes statistical distribution determination instructions 414 to determine, via the processor, a statistical distribution based on the determined similarity measures.

Computer readable medium 408 includes threshold determination instructions 416 to determine, via the processor, a threshold based on the statistical distribution.

Computer readable medium 408 includes additional similarity determination instructions 418 to determine, via the processor, additional similarity measures between a new data object in the data stream and the received data objects.

Computer readable medium 408 includes threshold comparison instructions 420 to automatically select a sub-plurality of the received data objects by comparing the additional similarity measures to the threshold.

Computer readable medium 408 includes update determination instructions 422 to determine, for each selected data object, if the respective retrieved neighbor list is to be incrementally updated based on neighborhood comparisons for the new data object and the selected data object.

Computer readable medium 408 includes neighbor list update instructions 424 to update the retrieved ranked neighbor list for the respective data object upon a determination that the neighbor list is to be updated.

In some examples, computer readable medium 408 includes instructions to provide, via the processor to a computing device, an incrementally updated computer generated visual rendition of the ranked neighbor lists, wherein the visual rendition is provided as the incoming data stream is received. In some examples, an incrementally updated kNN graph may be provided for display.

In some examples, computer readable medium 408 includes instructions to maintain a database of neighbor lists associated with data objects in the incoming data stream.

Input devices 404 include a keyboard, mouse, data ports, and/or other suitable devices for inputting information into processing system 400. In some examples, input devices 404, such as a computing device, are used to receive the incoming data stream. In some examples, input devices 404 may be utilized to receive the miss rate from a user via a computing device. In some examples, input devices 404 may be utilized to receive parameters $\alpha, \beta$ for the Beta distribution, from the user via the computing device. Output devices 406 include a monitor, speakers, data ports, and/or other suitable devices for outputting information from processing system 400. In some examples, output devices 406 are used to provide the incrementally updated computer generated visual rendition of the neighbor lists, and the kNN graph.

As used herein, a "computer readable medium" may be any electronic, magnetic, optical, or other physical storage apparatus to contain or store information such as executable instructions, data, and the like. For example, any computer readable storage medium described herein may be any of Random Access Memory (RAM), volatile memory, non-volatile memory, flash memory, a storage drive (e.g., a hard drive), a solid state drive, and the like, or a combination thereof. For example, the computer readable medium 408 can include one of or multiple different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices.

As described herein, various components of the processing system 400 are identified and refer to a combination of hardware and programming configured to perform a designated visualization function. As illustrated in FIG. 4, the programming may be processor executable instructions stored on tangible computer readable medium 408, and the hardware may include processor 402 for executing those instructions. Thus, computer readable medium 408 may store program instructions that, when executed by processor 402, implement the various components of the processing system 400.

Such computer readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

Computer readable medium 408 may be any of a number of memory components capable of storing instructions that can be executed by Processor 402. Computer readable medium 408 may be non-transitory in the sense that it does not encompass a transitory signal but instead is made up of one or more memory components configured to store the relevant instructions. Computer readable medium 408 may be implemented in a single device or distributed across devices. Likewise, processor 402 represents any number of processors capable of executing instructions stored by computer readable medium 408. Processor 402 may be integrated in a single device or distributed across devices. Further, computer readable medium 408 may be fully or partially integrated in the same device as processor 402 (as illustrated), or it may be separate but accessible to that device and processor 402. In some examples, computer readable medium 408 may be a machine-readable storage medium.

Figure 5:
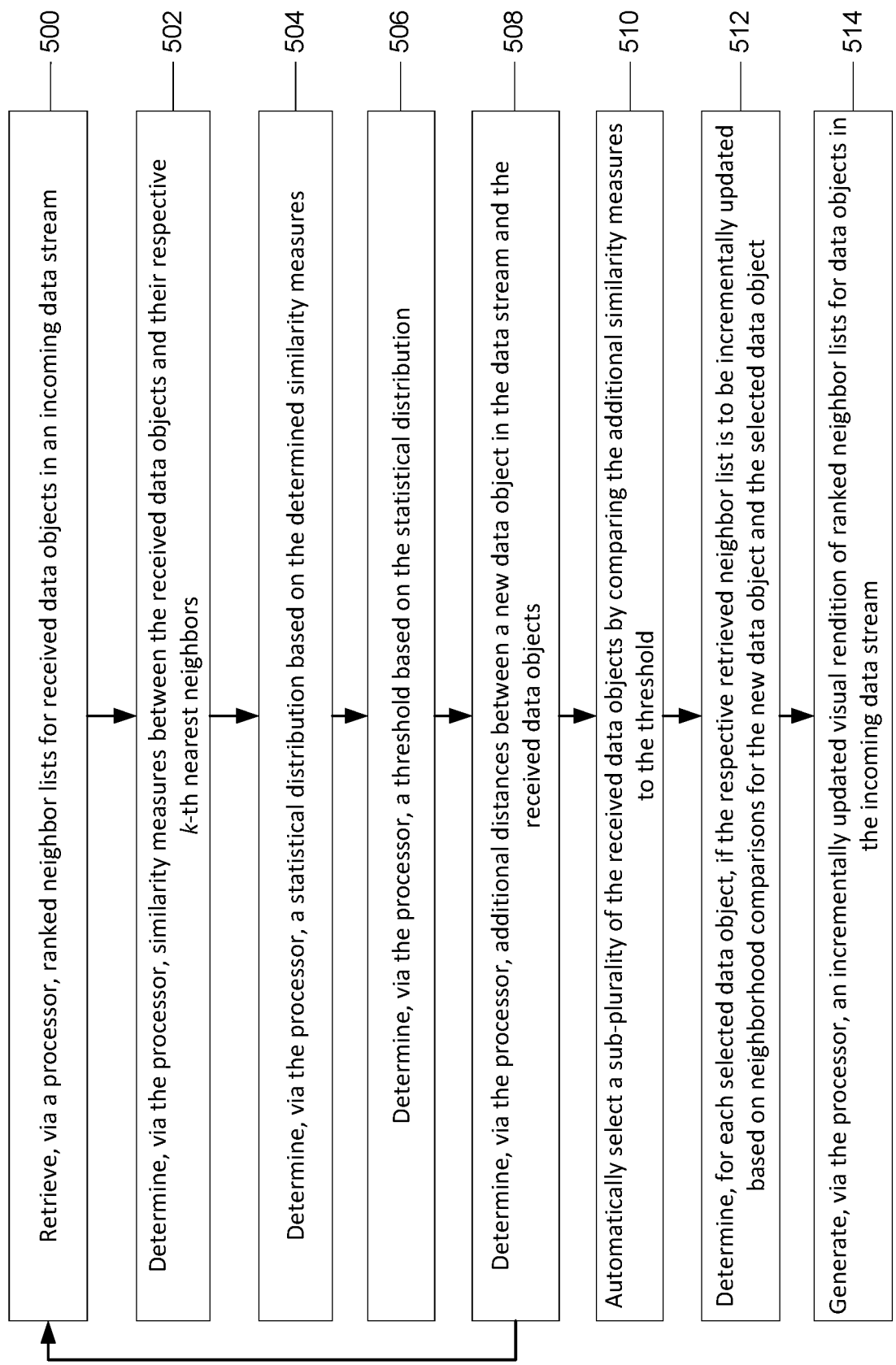
FIG. 5 is a flow diagram illustrating one example of a method for incremental automatic update of ranked neighbor lists based on k-th nearest neighbors.

FIG. 5 is a flow diagram illustrating one example of a method for incremental automatic update of ranked neighbor lists based on k-th nearest neighbors. In some examples, such an example method may be implemented by a system such as, for example, system 100 of FIG. 1.

At 500, ranked neighbor lists for received data objects in an incoming data stream are retrieved via a processor.

At 502, similarity measures between the received data objects and their respective k-th nearest neighbors are determined via the processor.

At 504, a statistical distribution based on the determined similarity measures is determined via the processor. In some examples, the statistical distribution is a Beta distribution.

At 506, a threshold based on the statistical distribution is determined via the processor.

At 508, additional similarity measures between a new data object in the data stream and the received data objects are determined via the processor. In some examples, the new data object is added to the list of received data objects. A ranked neighbor list for the new data object may be retrieved at 500. At 502, similarity measures between the received data objects and their respective k-th nearest neighbors are updated to include a similarity measure between the new data object and its k-th nearest neighbor. Accordingly, at 504, the statistical distribution is updated by including the similarity measure between the new data object and its k-th nearest neighbor, and at 506, the threshold is updated as well. In some examples, the processor may iteratively perform such an incremental, automatic update of the statistical distribution and the threshold based on each incoming data object in the incoming data stream.

At 510, a sub-plurality of the received data objects is automatically selected by comparing the additional similarity measures to the threshold.

At 512, for each selected data object, it may be determined if the respective retrieved neighbor list is to be incrementally updated, based on neighborhood comparisons for the new data object and the selected data object.

At 514, an incrementally updated visual rendition of neighbor lists for data objects in the incoming data stream is generated via the processor.

Figure 6:
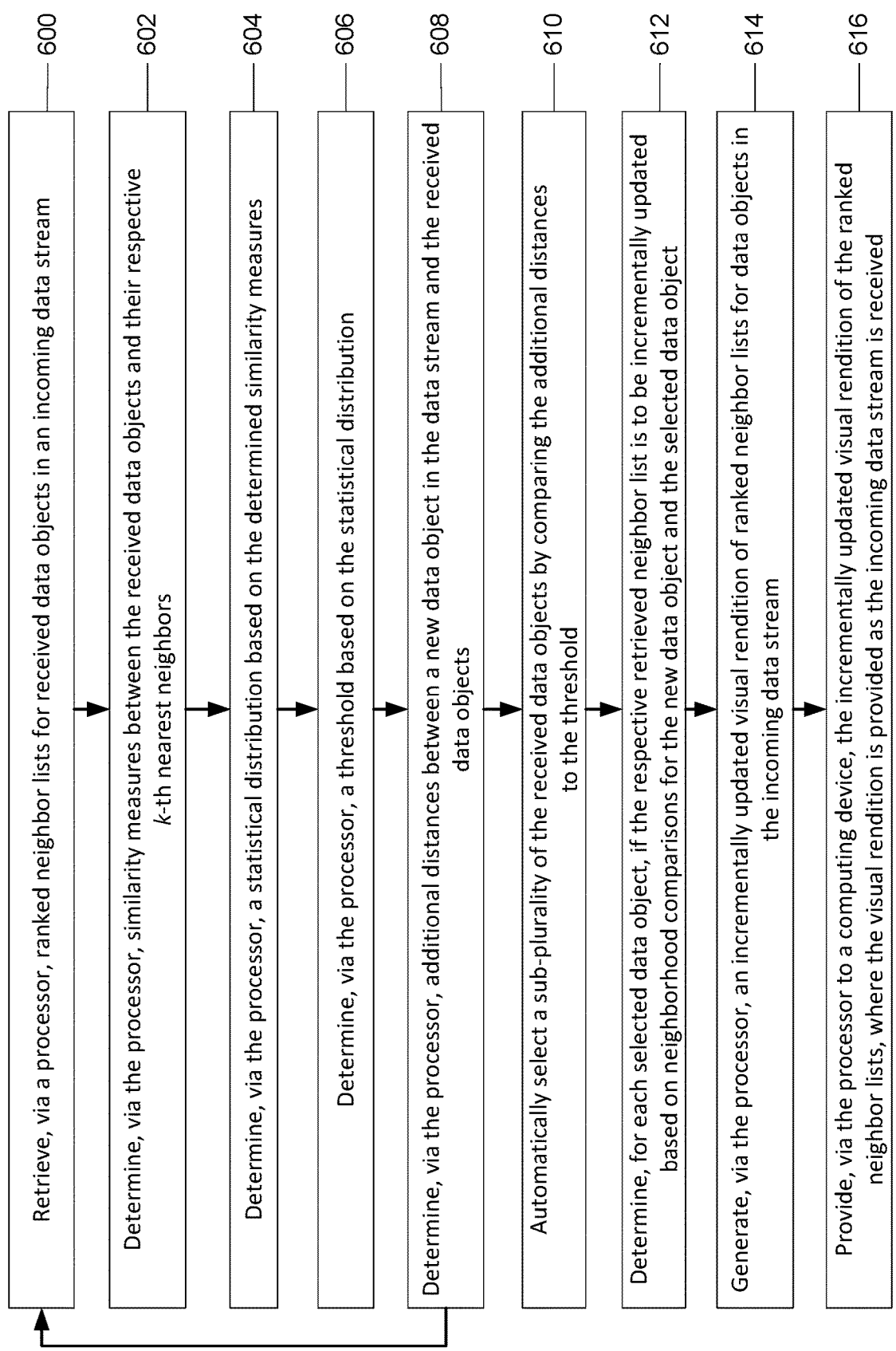
FIG. 6 is a flow diagram illustrating one example of a method for providing an incrementally updated computer generated visual rendition of ranked neighbor lists based on an incremental automatic update of ranked neighbor lists.

FIG. 6 is a flow diagram illustrating one example of a method for providing an incrementally updated computer generated visual rendition of neighbor lists based on an automatic selection of neighbor lists to be incrementally updated. In some examples, such an example method may be implemented by a system such as, for example, system 100 of FIG. 1.

At 600, ranked neighbor lists for received data objects in an incoming data stream are retrieved via a processor.

At 602, similarity measures between the received data objects and their respective k-th nearest neighbors are determined via the processor.

At 604, a statistical distribution based on the determined similarity measures is determined via the processor. In some examples, the statistical distribution is a Beta distribution.

At 606, a threshold based on the statistical distribution is determined via the processor.

At 608, additional similarity measures between a new data object in the data stream and the received data objects are determined via the processor. In some examples, the new data object is added to the list of received data objects. A ranked neighbor list for the new data object may be retrieved at 600. At 602, similarity measures between the received data objects and their respective k-th nearest neighbors are updated to include a similarity measure between the new data object and its k-th nearest neighbor. Accordingly, at 604, the statistical distribution is updated by including the similarity measure between the new data object and its k-th nearest neighbor, and at 606, the threshold is updated as well. In some examples, the processor may iteratively perform such an incremental, automatic update of the statistical distribution and the threshold based on each incoming data object in the incoming data stream.

At 610, a sub-plurality of the received data objects is automatically selected by comparing the additional similarity measures to the threshold.

At 612, for each selected data object, it may be determined if the respective retrieved neighbor list is to be incrementally updated, based on neighborhood comparisons for the new data object and the selected data object.

At 614, an incrementally updated visual rendition of neighbor lists for data objects in the incoming data stream is generated via the processor.

At 616, the incrementally updated visual rendition of the neighbor lists is provided via the processor to a computing device, where the visual rendition is provided as the incoming data stream is received.

Figure 7:
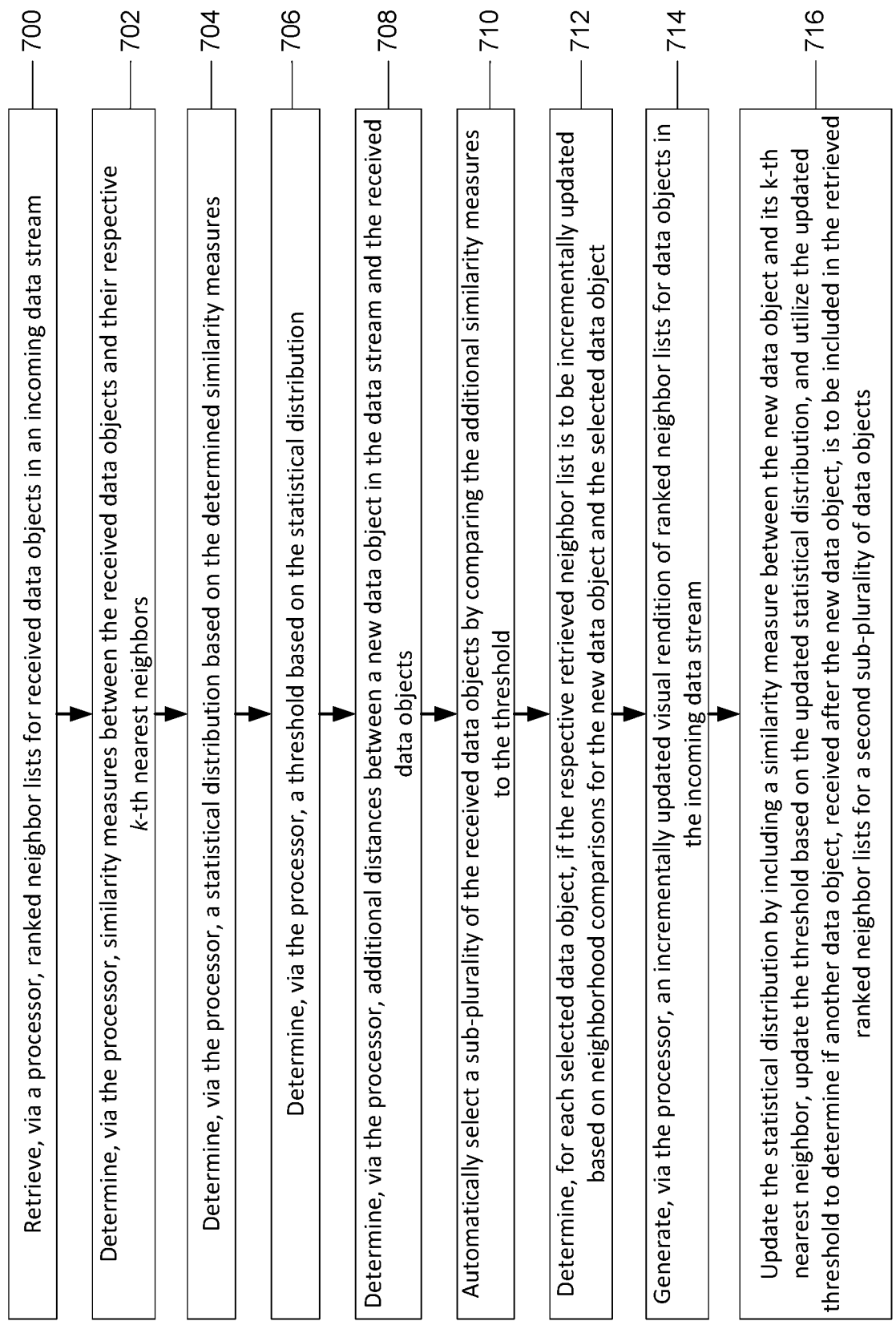
FIG. 7 is a flow diagram illustrating one example of a method for updating a threshold for an incremental automatic update of ranked neighbor lists based on k-th nearest neighbors.

FIG. 7 is a flow diagram illustrating one example of a method for updating a threshold for an incremental automatic update of ranked neighbor lists based on k-th nearest neighbors. In some examples, such an example method may be implemented by a system such as, for example, system 100 of FIG. 1.

At 700, ranked neighbor lists for received data objects in an incoming data stream are retrieved via a processor.

At 702, similarity measures between the received data objects and their respective k-th nearest neighbors are determined via the processor.

At 704, a statistical distribution based on the determined similarity measures is determined via the processor. In some examples, the statistical distribution is a Beta distribution.

At 706, a threshold based on the statistical distribution is determined via the processor.

At 708, additional similarity measures between a new data object in the data stream and the received data objects are determined via the processor. In some examples, the new data object is added to the list of received data objects. A ranked neighbor list for the new data object may be retrieved at 700. At 702, similarity measures between the received data objects and their respective k-th nearest neighbors are updated to include a similarity measure between the new data object and its k-th nearest neighbor. Accordingly, at 704, the statistical distribution is updated by including the similarity measure between the new data object and its k-th nearest neighbor, and at 706, the threshold is updated as well. In some examples, the processor may iteratively perform such an incremental, automatic update of the statistical distribution and the threshold based on each incoming data object in the incoming data stream.

At 710, a sub-plurality of the received data objects is automatically selected by comparing the additional similarity measures to the threshold.

At 712, for each selected data object, it may be determined if the respective retrieved neighbor list is to be incrementally updated, based on neighborhood comparisons for the new data object and the selected data object.

At 714, an incrementally updated visual rendition of neighbor lists for data objects in the incoming data stream is generated via the processor.

At 716, the statistical distribution is updated by including a similarity measure between the new data object and its k-th nearest neighbor. The threshold is updated based on the updated statistical distribution. The updated threshold is utilized to select a second sub-plurality of data objects for a second data object received after the new data object. The processor determines if the second data object is to be included in retrieved ranked neighbor lists for the second sub-plurality of data objects.

Figure 8:
FIG. 8 is a flow diagram illustrating one example of a method for maintaining a database of ranked neighbor lists based on an incremental automatic update of ranked neighbor lists.

FIG. 8 is a flow diagram illustrating one example of a method for maintaining a database of ranked neighbor lists based on an incremental automatic update of ranked neighbor lists. In some examples, such an example method may be implemented by a system such as, for example, system 100 of FIG. 1.

At 800, ranked neighbor lists for received data objects in an incoming data stream are retrieved via a processor.

At 802, similarity measures between the received data objects and their respective k-th nearest neighbors are determined via the processor.

At 804, a statistical distribution based on the determined similarity measures is determined via the processor. In some examples, the statistical distribution is a Beta distribution.

At 806, a threshold based on the statistical distribution is determined via the processor.

At 808, additional similarity measures between a new data object in the data stream and the received data objects are determined via the processor. In some examples, the new data object is added to the list of received data objects. A ranked neighbor list for the new data object may be retrieved at 800. At 802, similarity measures between the received data objects and their respective k-th nearest neighbors are updated to include a similarity measure between the new data object and its k-th nearest neighbor. Accordingly, at 804, the statistical distribution is updated by including the similarity measure between the new data object and its k-th nearest neighbor, and at 806, the threshold is updated as well. In some examples, the processor may iteratively perform such an incremental, automatic update of the statistical distribution and the threshold based on each incoming data object in the incoming data stream.

At 810, a sub-plurality of the received data objects is automatically selected by comparing the additional similarity measures to the threshold.

At 812, for each selected data object, it may be determined if the respective retrieved neighbor list is to be incrementally updated, based on neighborhood comparisons for the new data object and the selected data object.

At 814, an incrementally updated visual rendition of neighbor lists for data objects in the incoming data stream is generated via the processor.

At 816, a database of ranked neighbor lists associated with data objects in the incoming data stream is maintained.

Examples of the disclosure provide a generalized system for automatic selection of neighbor lists to be incrementally updated. The generalized system addresses business challenges of growing costs incurred in data storage, analytic processing and data communications, when data volumes are disproportionately high compared to utility in generating valuable insight. The key proposition is to identify a smaller number, m, of neighbor lists (as compared to a relatively large number of data objects n in the kNN graph) that need to be checked for a potential update when each new data object is received. The techniques described herein are data driven since the determined similarity measures, distributions of k-th largest similarities, threshold, etc. are updated with each incoming new data object. Accordingly, the system maintains an approximate nearest neighbor list of size k for each previously received data object after the arrival of every new data object in an incoming data stream, without directly computing the similarity/similarity measure between any pairs of data objects. This is generally achieved by maintaining an incrementally updated index, and dynamically updated ranked neighbor lists of neighbors for each data object. Since the threshold is based on a miss rate, the techniques provide a probabilistic model for accuracy-efficiency tradeoff.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein.

The invention claimed is:

1. A system comprising:
   a hardware processor, wherein the hardware processor performs:
   retrieving ranked neighbor lists for received data objects in an incoming data stream of data objects;
   determining similarity measures between the received data objects and their respective k-th nearest neighbors and wherein the evaluator is to determine additional similarity measures between a new data object in the data stream and the received data objects;
   determining a statistical distribution based on the determined similarity measures;
   determining a threshold based on the statistical distribution;
   and wherein the threshold is adjusted based on a miss rate, the miss rate being indicative of a margin of error in updating the retrieved neighbor lists for the received data objects when the new data object is received
   automatically selecting a sub-plurality of the received data objects by comparing the additional similarity measures to the threshold; and
   determining, for each selected data object, if the respective retrieved neighbor list is to be incrementally updated based on neighborhood comparisons for the new data object and the selected data object.

2. The system of claim 1, wherein the hardware processor further performs:
   updating the statistical distribution by including a similarity measure between the new data object and its k-th nearest neighbor, and update the threshold based on the updated statistical distribution; and
   utilizing the updated threshold to determine if a second data object, received after the new data object, is to be included in the retrieved ranked neighbor lists for a second sub-plurality of data objects.

3. The system of claim 1, wherein the hardware processor further performs providing an incrementally updated computer generated visual rendition of ranked neighbor lists for data objects in the incoming data stream.

4. The system of claim 1, wherein the ranked neighbor lists are based on an orthogonal transform based indexing of an incrementally updated neighbor graph.

5. The system of claim 1, wherein the statistical distribution is a Beta distribution.

6. A method comprising:
   retrieving, via a processor, ranked neighbor lists for received data objects in an incoming data stream;
   determining, via the processor, similarity measures between the received data objects and their respective k-th nearest neighbors;
   determining, via the processor, a statistical distribution based on the determined similarity measures;
   determining, via the processor, a threshold based on the statistical distribution;

determining, via the processor, additional similarity measures between a new data object in the data stream and the received data objects;

automatically selecting a sub-plurality of the received data objects by comparing the additional similarity measures to the threshold;

determining, for each selected data object, if the respective retrieved ranked neighbor list is to be incrementally updated based on neighborhood comparisons for the new data object and the selected data object;

adjusting the threshold based on a miss rate, wherein the miss rate is indicative of a margin of error in updating the retrieved neighbor lists for the received data objects when the new data object is received; and generating, via the processor, an incrementally updated visual rendition of ranked neighbor lists for data objects in the incoming data stream.

7. The method of claim 6, comprising:

updating the statistical distribution by including a similarity measure between the new data object and its k-th nearest neighbor;

updating the threshold based on the updated statistical distribution;

utilizing the updated threshold to select a second sub-plurality of data objects for a second data object received after the new data object; and determining if the second data object is to be included in retrieved ranked neighbor lists for the second sub-plurality of data objects.

8. The method of claim 6, comprising providing, via the processor to a computing device, the incrementally updated visual rendition of the ranked neighbor lists, wherein the visual rendition is provided as the incoming data stream is received.

9. The method of claim 6, wherein the ranked neighbor lists are based on an orthogonal transform based indexing of an incrementally updated neighbor graph.

10. The method of claim 6, comprising maintaining a database of ranked neighbor lists associated with data objects in the incoming data stream.

11. The method of claim 6, wherein the statistical distribution is a Beta distribution.

12. A non-transitory computer readable medium comprising executable instructions causing a processor to:

retrieve, via a processor, ranked neighbor lists for received data objects in an incoming data stream;

determine, via the processor, similarity measures between the received data objects and their respective k-th nearest neighbors;

determine, via the processor, a statistical distribution based on the determined similarity measures;

determine, via the processor, a threshold based on the statistical distribution;

determine, via the processor, additional similarity measures between a new data object in the data stream and the received data objects;

automatically select a sub-plurality of the received data objects by comparing the additional similarity measures to the threshold;

determine, for each selected data object, if the respective retrieved neighbor list is to be incrementally updated based on neighborhood comparisons for the new data object and the selected data object;

adjust the threshold based on a miss rate, wherein the miss rate is indicative of a margin of error in updating the retrieved neighbor lists for the received data objects when the new data object is received; and update the retrieved ranked neighbor list for the respective data object upon a determination that the neighbor list is to be updated.

13. The non-transitory computer readable medium of claim 12, wherein the ranked neighbor lists are based on an orthogonal transform based indexing of an incrementally updated neighbor graph.

14. The non-transitory computer readable medium of claim 12, comprising instructions to provide, via the processor to a computing device, an incrementally updated computer generated visual rendition of the ranked neighbor lists, wherein the visual rendition is provided as the incoming data stream is received.

* * * * *